(12) United States Patent
Ahn et al.

(10) Patent No.: US 10,710,102 B2
(45) Date of Patent: Jul. 14, 2020

(54) FLUID PERMEABLE MEMBER

(71) Applicant: POINT ENGINEERING CO., LTD., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: POINT ENGINEERING CO., LTD., Asan-si (KR)

( * ) Notice: Subject to any disclaimer, the term of this patent is extended or adjusted under 35 U.S.C. 154(b) by 130 days.

(21) Appl. No.: 15/699,681

(22) Filed: Sep. 8, 2017

(65) Prior Publication Data

US 2019/0076854 A1 Mar. 14, 2019

(51) Int. Cl.
| | | |
|---|---|---|
| *H01M 6/18* | (2006.01) | |
| *B05B 1/18* | (2006.01) | |
| *C25D 11/04* | (2006.01) | |
| *C23C 16/455* | (2006.01) | |
| *B05B 1/00* | (2006.01) | |
| *C25D 11/26* | (2006.01) | |
| *C25D 11/34* | (2006.01) | |

(52) U.S. Cl.
CPC ............. *B05B 1/185* (2013.01); *B05B 1/005* (2013.01); *C23C 16/45559* (2013.01); *C23C 16/45565* (2013.01); *C25D 11/04* (2013.01); *C25D 11/045* (2013.01); *C25D 11/26* (2013.01); *C25D 11/34* (2013.01)

(58) Field of Classification Search
CPC ... B05B 1/185; B05B 1/005; C23C 16/45559; C23C 16/45565; C25D 11/04; H01M 2/1686; H01M 2/16
See application file for complete search history.

(56) References Cited

U.S. PATENT DOCUMENTS

| | | | |
|---|---|---|---|
| 2004/0154488 A1* | 8/2004 | Tomita | B41N 1/08 101/458 |
| 2007/0217822 A1* | 9/2007 | Deguchi | G03G 15/0233 399/171 |

FOREIGN PATENT DOCUMENTS

| | | |
|---|---|---|
| KR | 10-0653442 B1 | 11/2006 |
| KR | 10-2012-0027257 A | 3/2012 |

OTHER PUBLICATIONS

Korean Office Action dated Aug. 2, 2017, issued by the Korean Intellectual Property Office in corresponding application KR 10-2016-0071716.

* cited by examiner

*Primary Examiner* — Raymond Alejandro
(74) *Attorney, Agent, or Firm* — Stein IP, LLC

(57) ABSTRACT

A fluid permeable member includes a support body provided in a lower portion thereof with a support plate having a fluid permeable through-hole, and a fluid permeable anodic oxide film disposed on the support plate.

6 Claims, 11 Drawing Sheets

PRIOR ART

FLUID PERMEABLE MEMBER

TECHNICAL FIELD

The present invention relates to a fluid permeable member for allowing a fluid to pass therethrough and uniformly diffusing the fluid.

BACKGROUND

A fluid permeable member is configured to allow a fluid (a gas or a liquid) to pass through and is used for the purpose of diffusion, separation, purification, filtering, analysis, reaction, or the like of the fluid.

In general, a large number of fluid permeable holes are formed in the fluid permeable member. In order for a fluid to pass through the fluid permeable member and to be uniformly distributed, it is preferable that the inner width of the holes is small and the number of the holes is large. However, from the viewpoint of manufacturing, many difficulties are involved in forming the holes to have a small inner width.

As an example of the fluid permeable member described above, there is known a diffuser (shower head) that uniformly distributes a gas on a glass plate disposed in a vacuum chamber for manufacturing a liquid crystal display (LCD) or a semiconductor wafer. The liquid crystal display (LCD) is a non-light-emitting element that obtains an image effect using the characteristics of a liquid crystal injected between an array substrate and a color filter substrate. Each of the array substrate and the color filter substrate is manufactured by depositing, patterning and etching a thin film, several times, on a transparent glass plate made of a material such as a glass or the like. In the case where a deposition process is performed by introducing a reactive material and a source material into a vacuum chamber in a gaseous state, the introduced gases pass through a diffuser (shower head) and are deposited on a glass plate mounted on a susceptor to form a thin film.

A diffuser (shower head) as the aforementioned fluid permeable member is disclosed in Korean Patent No. 0653442.

As shown in FIG. 1, a reaction gas introduced through an introduction part 18 passes (permeates) through a diffuser 15 and is injected onto a glass plate or a wafer mounted on a susceptor S.

However, the conventional diffuser has a problem in that the holes formed in the diffuser cannot uniformly inject the reaction gas onto the glass plate. In an effort to ameliorate this problem, it is conceivable to adopt a method of reducing the inner width of the holes and increasing the number of the holes. However, this method has a limit from the viewpoint of manufacturing.

PRIOR ART DOCUMENT

Patent Document (Patent document 1): Korean Patent No. 0653442

SUMMARY

In view of the problems mentioned above, it is an object of the present invention to provide a fluid permeable member including a fluid permeable anodic oxide film capable of enabling uniform diffusion of a fluid.

According to one aspect of the present invention, there is provided a fluid permeable member, including: a support body provided in a lower portion thereof with a support plate having a fluid permeable through-hole; and a fluid permeable anodic oxide film disposed on the support plate.

In the fluid permeable member, the fluid permeable anodic oxide film may have a plurality of regularly-arranged pores formed by anodizing a metal and configured to vertically penetrate the fluid permeable anodic oxide film.

In the fluid permeable member, the fluid permeable anodic oxide film may include a porous layer formed by anodizing a metal and having regularly-arranged pores, and a barrier layer formed under the porous layer to close lower ends of the pores, and permeation holes having a larger inner width than the pores and vertically penetrating the fluid permeable anodic oxide film may be formed in the fluid permeable anodic oxide film.

In the fluid permeable member, the fluid permeable anodic oxide film may include a barrier layer formed by anodizing a metal, and permeation holes vertically penetrating the fluid permeable anodic oxide film may be formed in the barrier layer.

In the fluid permeable member, the fluid permeable anodic oxide film may be formed by anodizing a metallic base material and then removing the metallic base material.

In the fluid permeable member, the support plate may have a mesh structure.

In the fluid permeable member, the support plate may be divided into a plurality of regions, and the fluid permeable anodic oxide film may be installed in each of the regions.

In the fluid permeable member, the support body may be made of a metal.

In the fluid permeable member, the through-hole may have a shape corresponding to an external shape of the fluid permeable anodic oxide film, and the fluid permeable anodic oxide film may be supported in a rim portion defining the through-hole.

The following effects may be achieved by the present invention.

It is possible to uniformly diffuse a fluid. The fluid permeable anodic oxide film may be easily provided inside the support body without requiring a separate component. Owing to the mesh structure of the support plate, it is possible to support the fluid permeable anodic oxide film while allowing a fluid to pass therethrough. The support body may be used as an electrode because the support body is made of a metal. The fluid passing through the fluid permeable anodic oxide film may smoothly flow without being obstructed by the support plate.

DETAILED DESCRIPTION

Figure 1:
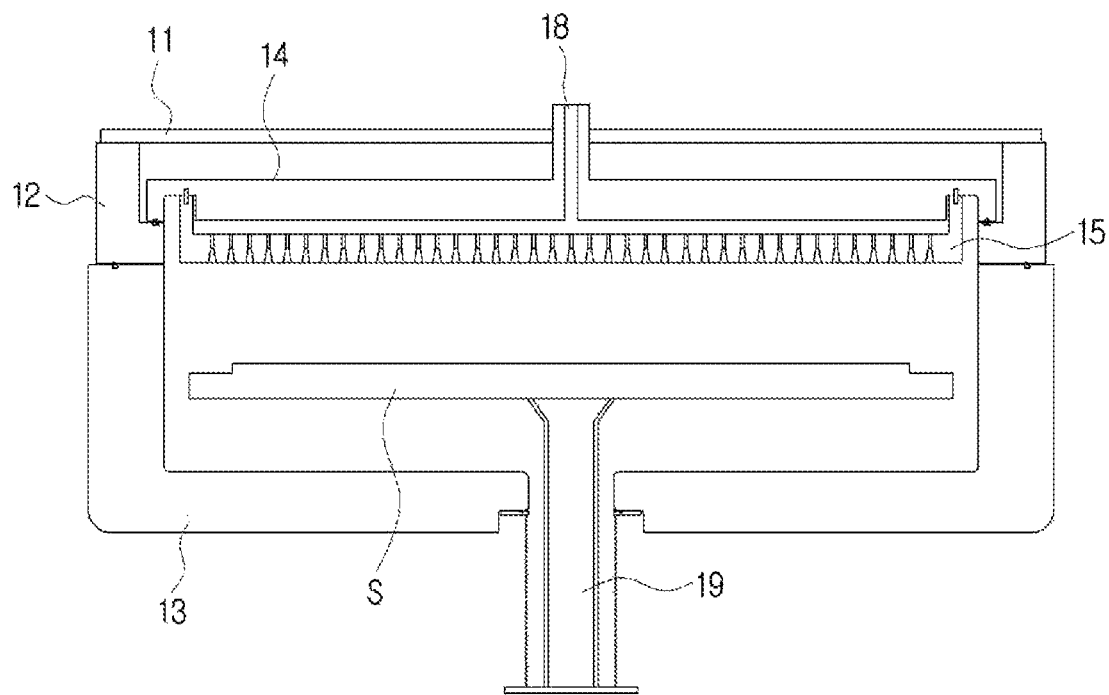
FIG. 1 is a sectional view of a vacuum chamber including a conventional fluid permeable member (diffuser).

Preferred embodiments of the present invention will now be described in detail with reference to the accompanying drawings. The advantages, features and methods for achieving the same will become apparent from the following description of preferred embodiments given in conjunction with the accompanying drawings. However, the present invention is not limited to the embodiments described herein but may be embodied in many different forms. Rather, the embodiments disclosed herein are provided in order to ensure that the disclosure becomes thorough and perfect and to ensure that the concept of the present invention is sufficiently delivered to a person having an ordinary knowledge in the relevant art. The present invention is defined only by the claims. Throughout the specification, the same reference symbols designate like components.

The terms used herein are presented for the description of the embodiments but are not intended to limit the present invention. In the subject specification, a singular form includes a plural form unless specifically mentioned otherwise. By the term "comprises" or "comprising" used herein, it is meant that a component, a step, an operation or an element referred to herein does not exclude existence or addition of one or more other components, steps, operations or elements. Furthermore, the reference symbols presented in the order of descriptions is not necessarily limited to the specified order.

The embodiments disclosed herein will be described with reference to sectional views and/or plan views which are ideal exemplary views illustrating the present invention. In the drawings, the thickness of a film and a region is exaggerated to effectively describe the technical contents. Thus, the form of exemplary views may be changed depending on a manufacturing technique and/or a tolerance. For that reason, the embodiments of the present invention are not limited to specific formed illustrated in the drawings but may include changes in form generated depending on a manufacturing process. Accordingly, the regions illustrated in the drawings have general attributes. The shapes of the regions illustrated in the drawings merely illustrate specific forms of element regions and do not limit the scope of the invention.

In the description of various embodiments, for the sake of convenience, the same name and the same reference numeral will be given to a component performing the same function even in different embodiments. In addition, description will be omitted on the configuration and operation described in other embodiments.

As shown in FIGS. 2 to 9, the fluid permeable member 100 according to a first preferred embodiment of the present invention includes: a support body 110 provided in a lower portion thereof with a support plate 115 having fluid permeable through-holes 117; and a fluid permeable anodic oxide film 300 disposed on the support plate 115.

The size and thickness of the through-holes 117, the fluid permeable anodic oxide film 300, the pores 310 and the permeation holes 350 shown in FIGS. 2 to 9 are exaggerated for effective description of technical contents.

Figure 2:
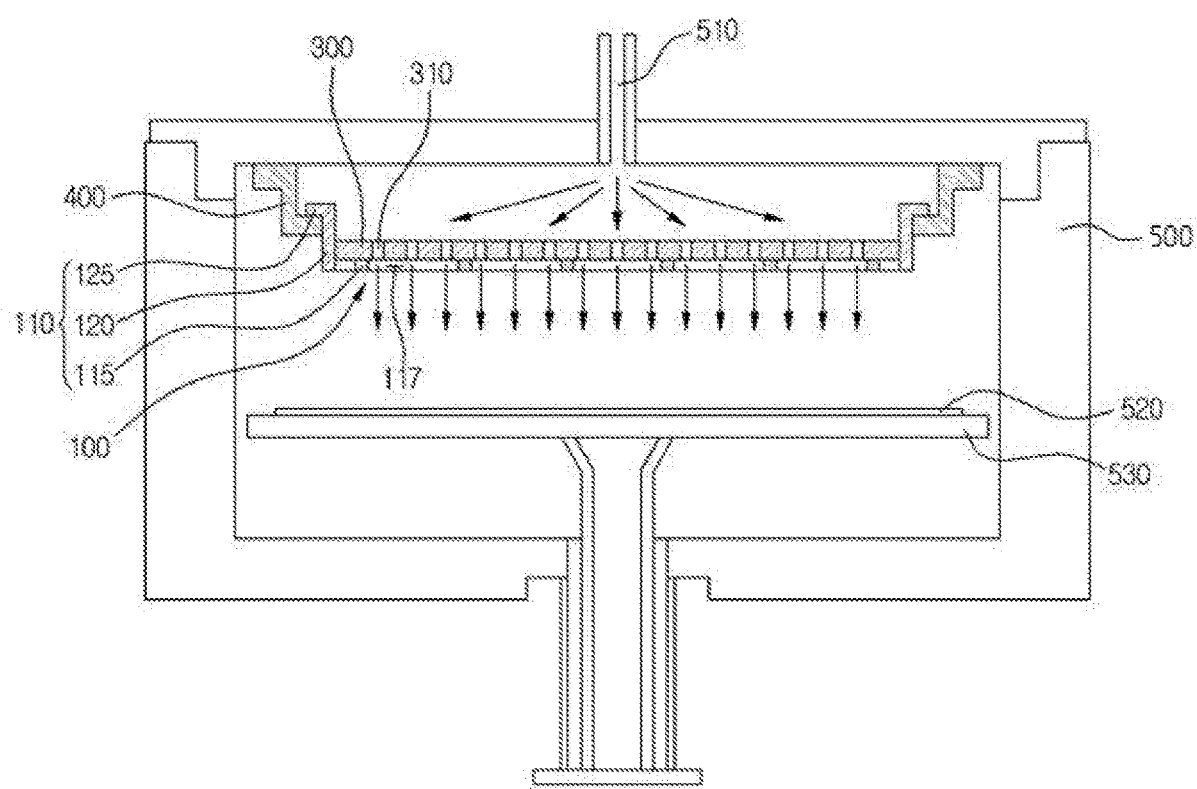
FIG. 2 is a sectional view showing a state in which a fluid permeable member according to a first preferred embodiment of the present invention is installed inside a vacuum chamber.
Figure 3:
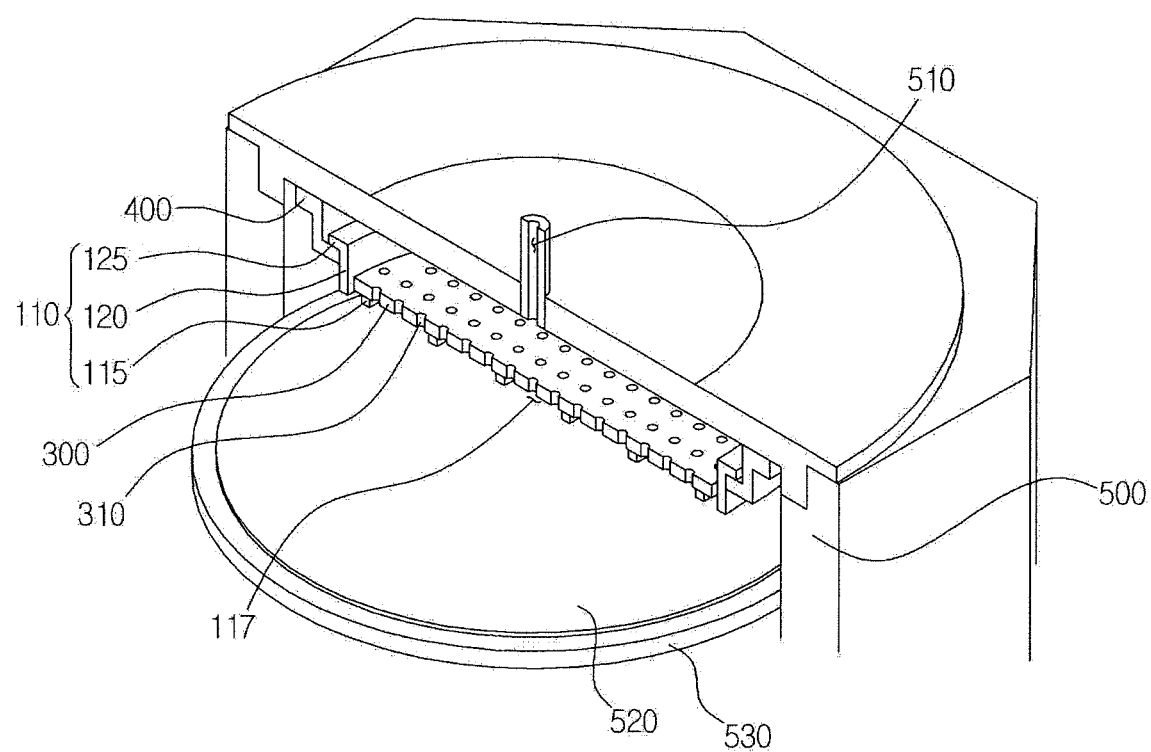
FIG. 3 is a partially cutaway perspective view showing the upper portion of the vacuum chamber shown in FIG. 2.
Figure 4:
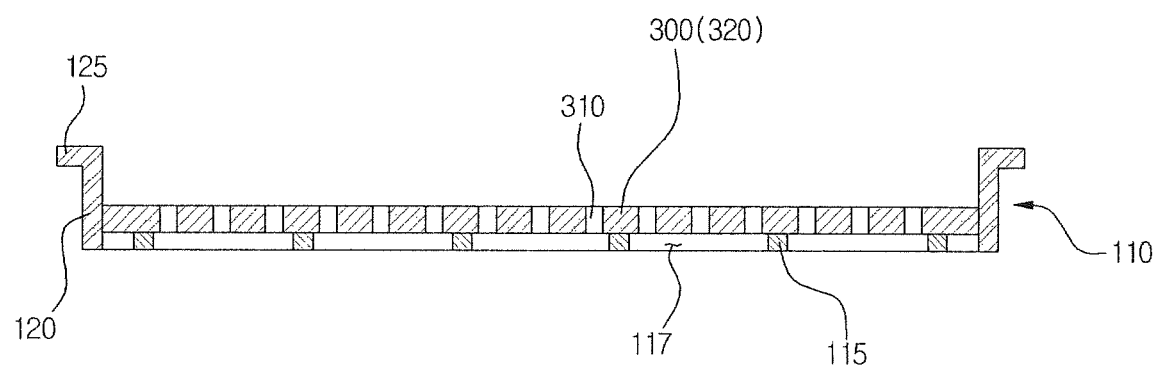
FIG. 4 is a sectional view of the fluid permeable member shown in FIG. 2.

In the present embodiment, the fluid permeable member 100 is a diffuser installed inside a vacuum chamber 500 as shown in FIGS. 2 and 3.

A mounting bracket 400 is installed in the inner upper portion of the vacuum chamber 500. The lower portion of the mounting bracket 400 is bent inward and formed to extend horizontally. A flange 125 of the fluid permeable member 100 is placed on and supported by the lower portion of the mounting bracket 400.

The fluid permeable member 100 serves to permeate (pass) a reaction gas introduced through a gas introduction part 510 and to inject the reaction gas toward a wafer 520 or a glass plate placed on the upper surface of a susceptor 530. The diffuser installed inside the vacuum chamber 500 is well-known in the art including the prior art described above. Therefore, detailed description thereof will be omitted therein.

In the present embodiment, the fluid permeable member 100 is shown to have a cylindrical shape for the manufacture of a semiconductor wafer. In order to manufacture a liquid crystal display, it is preferred that the fluid permeable member 100 has a rectangular parallelepiped shape. The shape of the fluid permeable member 100 may be changed depending on the installation environment and condition.

As shown in FIGS. 2 to 6, the fluid permeable member 100 includes a support body 110 provided in a lower portion thereof with a support plate 115 and opened in an upper portion thereof, and a fluid permeable anodic oxide film 300 disposed on the support plate 115.

Figure 5:
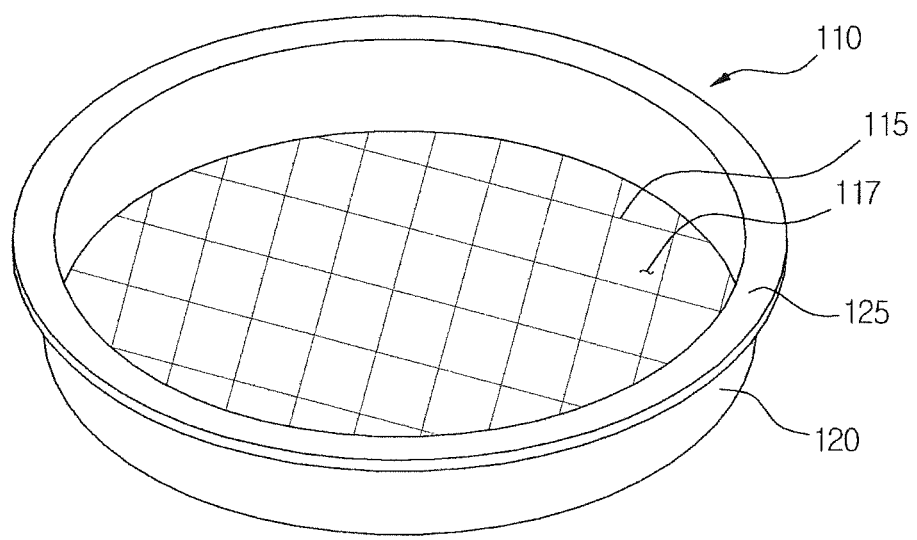
FIG. 5 is a perspective view showing a support body.
Figure 6:
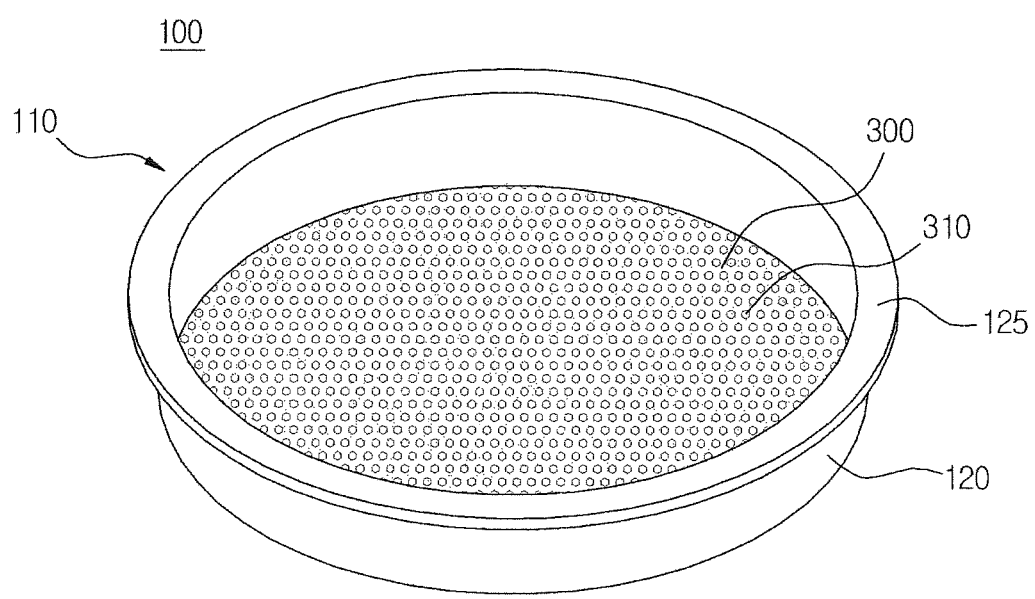
FIG. 6 is a perspective view showing a fluid permeable member including a fluid permeable anodic oxide film.

As shown in FIG. 5, the support body 110 is formed in a cylindrical shape with an upper portion thereof opened. As shown in FIGS. 2 to 6, the support body 110 includes a support plate 115 having fluid permeable through-holes 117, a side wall 120 connected to the outer periphery of the support plate 115 and formed to extend upward, and a flange 125 horizontally extending outward from the upper end of the side wall 120.

The support plate 115 is formed in a mesh structure and includes a plurality of vertically extending through-holes 117. It is preferred that the through-holes 117 are larger in inner width than the pores 310 of the fluid permeable anodic oxide film 300. The through-holes 117 communicate with the pores 310. Thus, the reaction gas uniformly diffused while passing through the pores 310 may be injected toward the wafer 520 through the through-holes 117.

The fluid permeable anodic oxide film 300 is placed on and supported by the upper surface of the support plate 115 having the through-holes 117 described above.

Due to the mesh structure, the support plate 115 may allow a fluid to pass therethrough while supporting the fluid permeable anodic oxide film 300. More specifically, the support plate 115 serves to allow easier passage of the reaction gas uniformly diffused through the pores 310 and serves to support the fluid permeable anodic oxide film 300 so as not to be bulged downward by the pressure of the reaction gas.

Figure 8A:
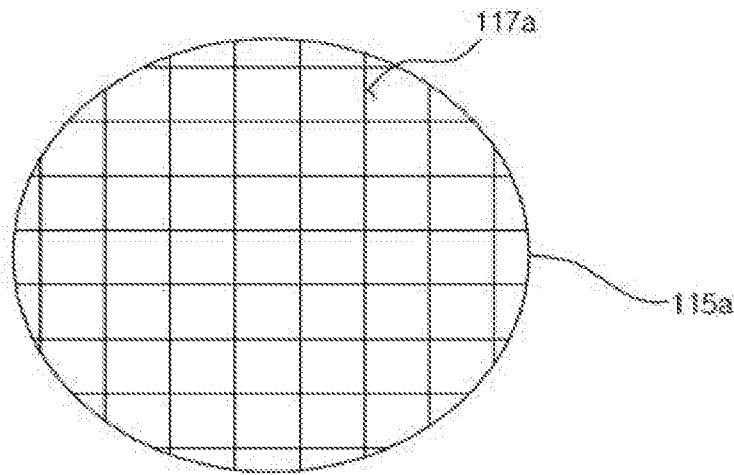
FIGS. 8A to 8C are plan views showing modifications of the support plate.
Figure 8B:
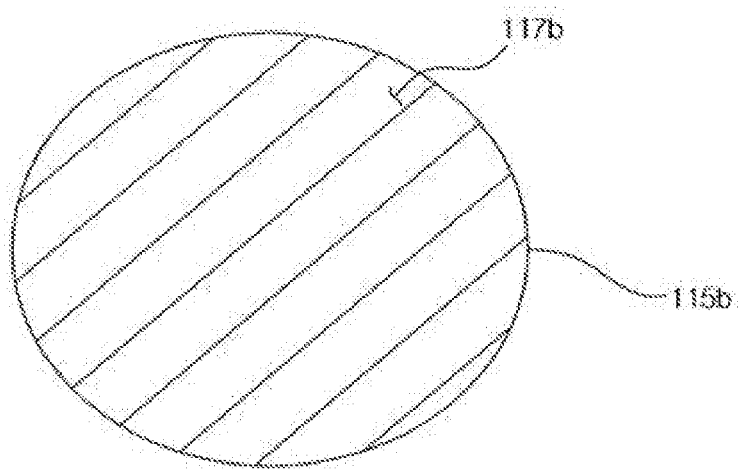
Figure 8C:
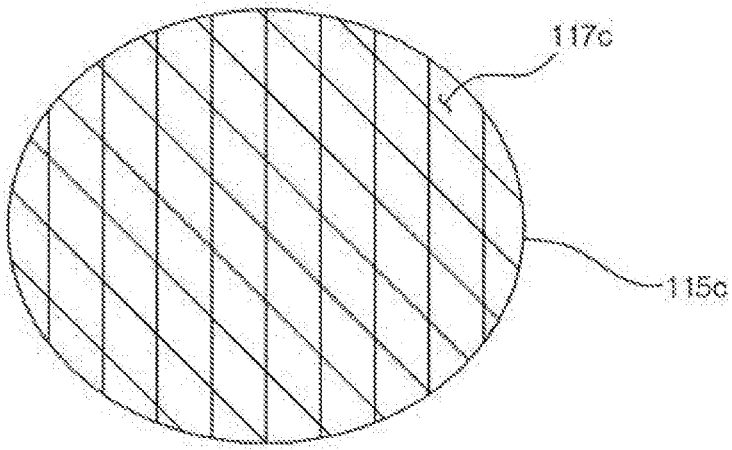

The support plate 115 having a mesh structure may be formed in many different forms. For example, as shown in FIG. 8A, a support plate 115a may be formed to have rectangular through-holes 117a. As shown in FIG. 8B, a support plate 115b may be formed to have long rectangular through-holes 117b arranged in parallel. As shown in FIG. 8C, a support plate 115c may be formed to have parallelogram-like through-holes 117C.

The side wall 120 connected to the outer periphery of the support plate 115 is formed in a hollow cylindrical shape and is opened in an upper portion thereof.

The fluid permeable anodic oxide film 300 may be inserted through the open upper portion of the side wall 120 and may be placed on and supported by the upper surface of the support plate 115. The fluid permeable anodic oxide film 300 is inserted into the support body 110 and is surrounded by the side wall 120. Therefore, the fluid permeable anodic oxide film 300 may be easily installed inside the support body 110 without requiring a separate component for the installation of the fluid permeable anodic oxide film 300.

A flange 125 bent outward at a right angle and extending horizontally is formed in the upper portion of the side wall 120. As shown in FIGS. 2 and 3, the flange 125 is placed on and supported by the upper surface of the bent lower portion of the mounting bracket 400. Thus, the support body 110, namely the fluid permeable member 100 is easily installed under the gas introduction part 510 inside the vacuum chamber 500. The support body 110 is made of a metallic material and may be used as an electrode.

Hereinafter, description will be made on the fluid permeable anodic oxide film 300 inserted into the support body 110 and place on and supported by the upper surface of the support plate 115.

In the present embodiment, the fluid permeable anodic oxide film 300 is shown to have a disc shape conforming to the shape of the support plate 115.

The fluid permeable anodic oxide film 300 is formed to have a smaller transverse width than the support plate 115 so that the fluid permeable anodic oxide film 300 is inserted through the open upper portion of the side wall 120 and is placed on and supported by the upper surface of the support plate 115.

Figure 7A:
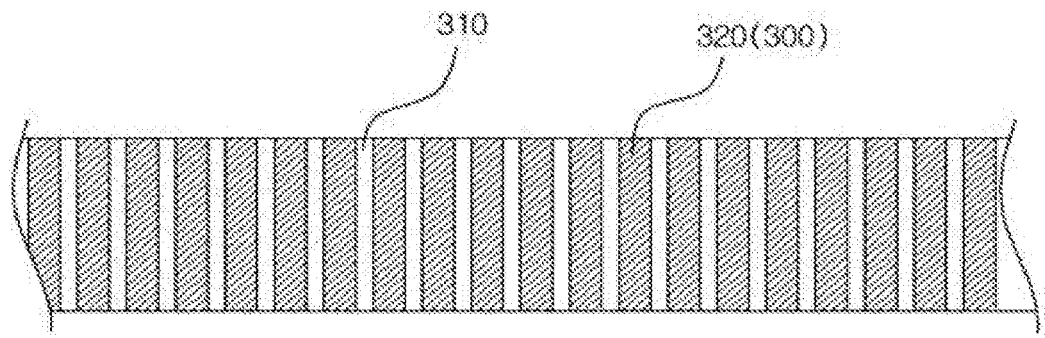
FIGS. 7A to 7C are partially enlarged sectional views showing modifications of the fluid permeable anodic oxide film.
Figure 7B:
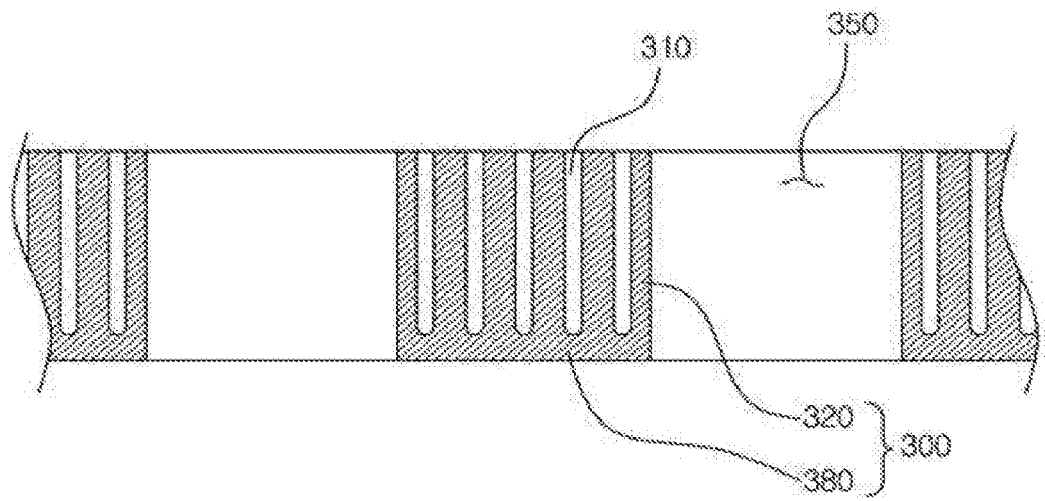
Figure 7C:
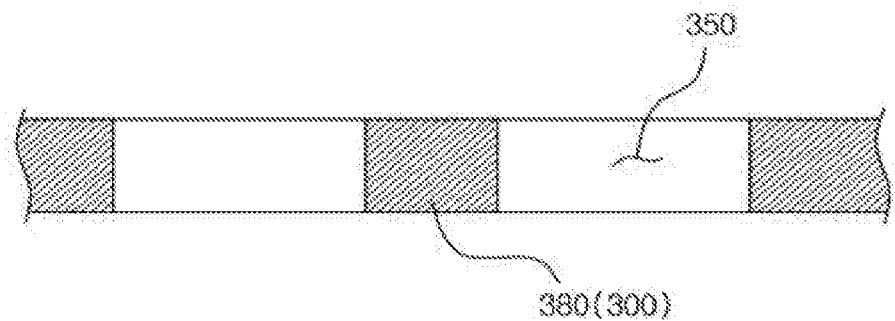

Various modifications of the fluid permeable anodic oxide film 300 will now be describe with reference to FIGS. 7A to 7C.

The fluid permeable anodic oxide film 300 is formed by anodizing a metallic base material and then removing the metallic base material. The metallic base material may be aluminum (Al), titanium (Ti), tungsten (WO, zinc (Zn) or the like, among which aluminum (Al) is particularly preferred. The fluid permeable anodic oxide film 300 formed using aluminum as a base material has a chemical formula $Al_2O_3$. The fluid permeable anodic oxide film 300 has an insulating property.

The fluid permeable anodic oxide film 300 shown in FIGS. 2 to 4 and 7A has a plurality of regularly-arranged pores 310 formed by anodizing a metal and configured to vertically penetrate the fluid permeable anodic oxide film 300. In other words, the fluid permeable anodic oxide film 300 is formed of only a porous layer 320 having pores 310.

The fluid permeable anodic oxide film 300 is formed by anodizing a metal and then removing not only the metal but also a barrier layer 380. Thus, the pores 310 vertically penetrate the fluid permeable anodic oxide film 300. Since the pores 310 are fluid permeable, the reaction gas may be uniformly diffused and injected through the pores 310.

The inner width of the pores 310 may be in a range of several nm (nanometer to 300 nm.

The metal used as a base material of the fluid permeable anodic oxide film 300 may include aluminum. That is to say, the metal may preferably be aluminum or aluminum alloy. The fluid permeable anodic oxide film 300 may preferably be an aluminum oxide film formed by anodizing aluminum.

As shown in FIG. 7B, the fluid permeable anodic oxide film 300 includes a porous layer 320 formed by anodizing a metal and having regularly-arranged pores 310, and a barrier layer 380 formed under the porous layer 320 to close lower ends of the pores 310. Permeation holes 350 having a larger inner width than the pores 310 and vertically penetrating the fluid permeable anodic oxide film 300 may be formed in the fluid permeable anodic oxide film 300.

In the fluid permeable anodic oxide film 300 shown in FIG. 7B, a plurality of pores 310 is formed so as to vertically extend. The upper ends of the pores 310 are formed so as to penetrate the upper surface of the fluid permeable anodic oxide film 300, namely the upper surface of the porous layer 320. The lower ends of the pores 310 are closed by the barrier layer 380.

The permeation holes 350 vertically penetrating the fluid permeable anodic oxide film 300 are formed to penetrate both the porous layer 320 and the barrier layer 380. The permeation holes 350 are formed in a plural number.

The pores 310 positioned between two adjacent permeation holes 350. It is preferred that the separation distance between two adjacent pores 310 is smaller than the separation distance between two adjacent permeation holes 350. The inner width of the permeation holes 350 is larger than the inner width of the pores 310. The permeation holes 350 are formed in parallel with the pores 310 so as to extend vertically.

The permeation holes 350 are formed by etching. The permeation holes 350 may have an inner width which is constant from one end surface of the fluid permeable anodic oxide film 300 to the other end surface of the fluid permeable anodic oxide film 300. The inner width of the permeation holes 350 may be in a range of 300 nm (nanometer) to several mm (millimeter).

Referring to FIG. 7C, the fluid permeable anodic oxide film 300 is composed of a barrier layer 380 formed by anodizing a metal. Permeation holes 350 vertically penetrating the fluid permeable anodic oxide film 300 may be formed in the barrier layer 380.

Figure 9:
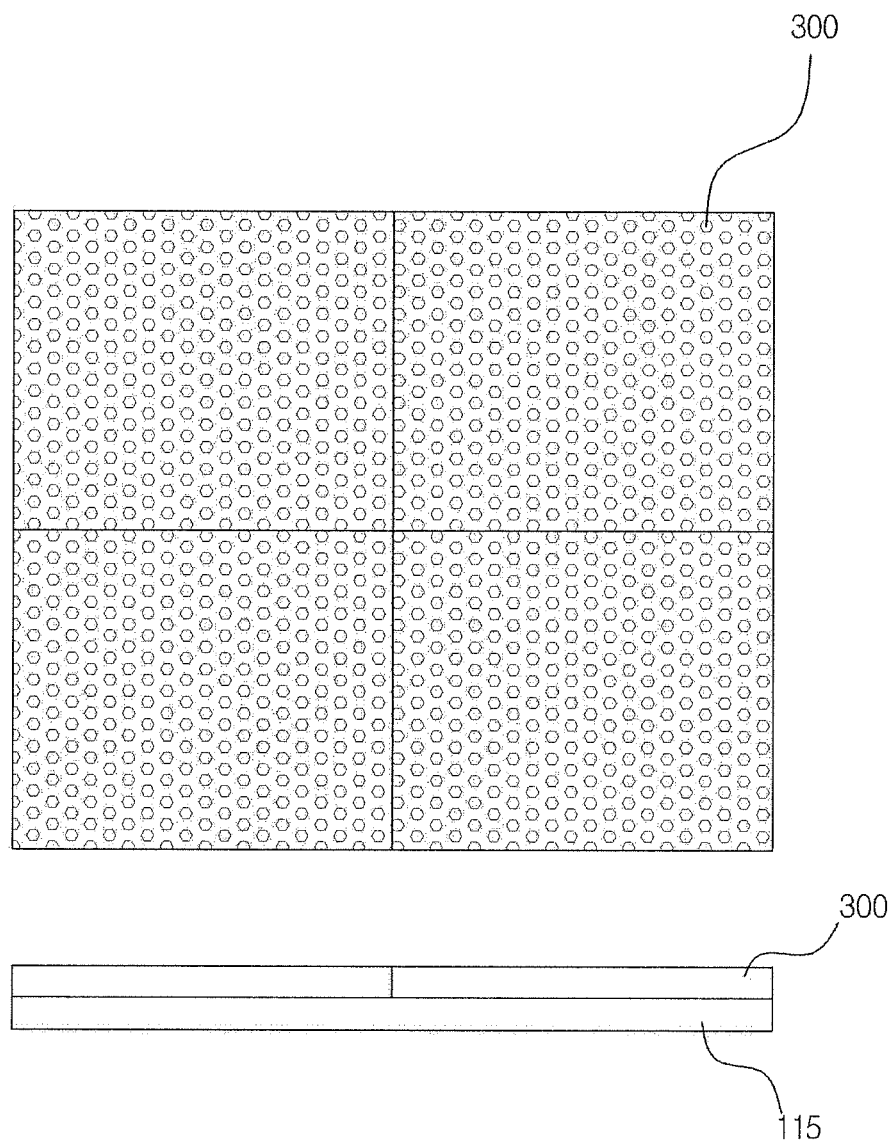
FIG. 9 is a plan view and a front view showing a state in which a fluid permeable anodic oxide film is provided on a support plate having a large area.

In order to manufacture a liquid crystal display having a large area, the support plate 115 of the fluid permeable member 100 is formed to have a large area corresponding to the area of the liquid crystal display. As shown in FIG. 9, a plurality of fluid permeable anodic oxide films 300 may be installed on the support plate 115.

In other words, as shown in FIG. 9, when the support plate 115 has a large area, the support plate 115 is divided into a plurality of regions. The fluid permeable anodic oxide film 300 may be placed on and supported by each of the regions of the fluid permeable anodic oxide film 300.

Figure 10:
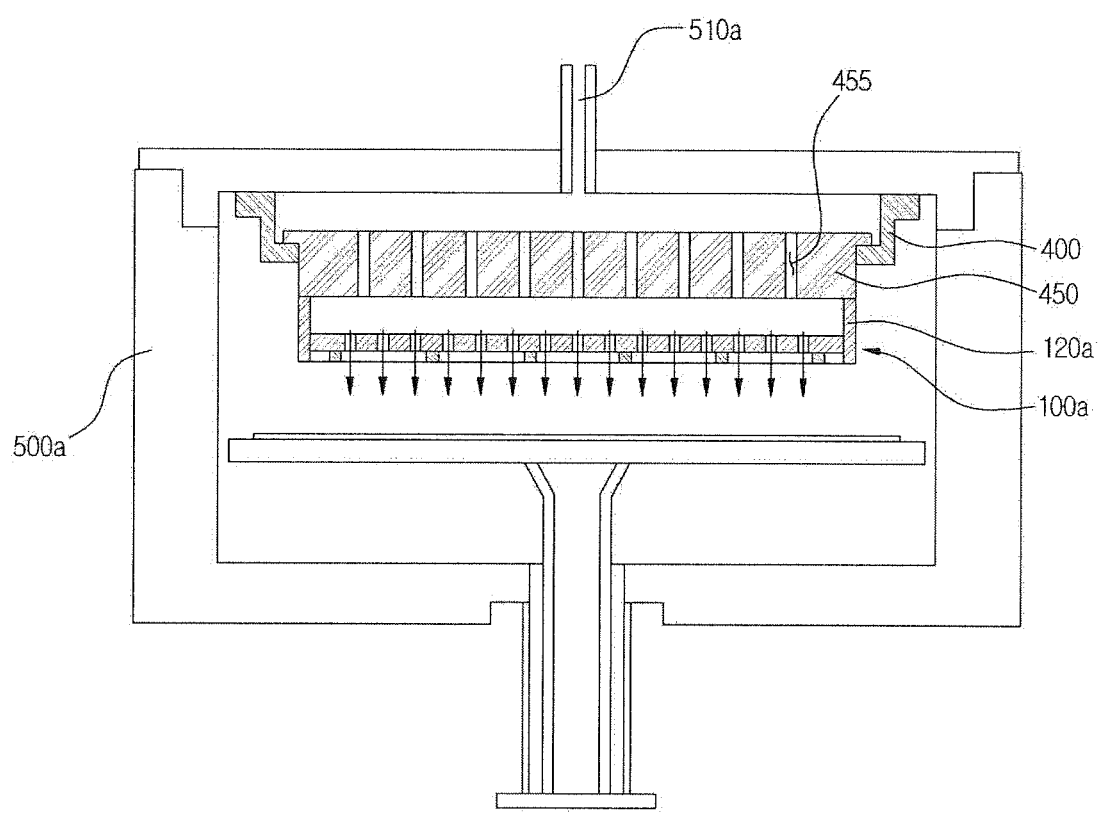
FIG. 10 is a sectional view showing a state in which a fluid permeable member according to a second preferred embodiment of the present invention is installed inside a vacuum chamber.

In FIG. 10, there is shown a second embodiment of the present invention. In the second embodiment, a fluid permeable member 100a may be coupled to the lower portion of a conventional diffuser 450 that allows a fluid to pass through holes 455 and diffuses the fluid. Unlike the first embodiment, in the second embodiment, no flange is provided in the upper portion of the side wall 120a of the fluid permeable member 100a. The upper end of the side wall 120a may be fixed to the lower portion of the diffuser 450 by welding or the like.

Figure 11:
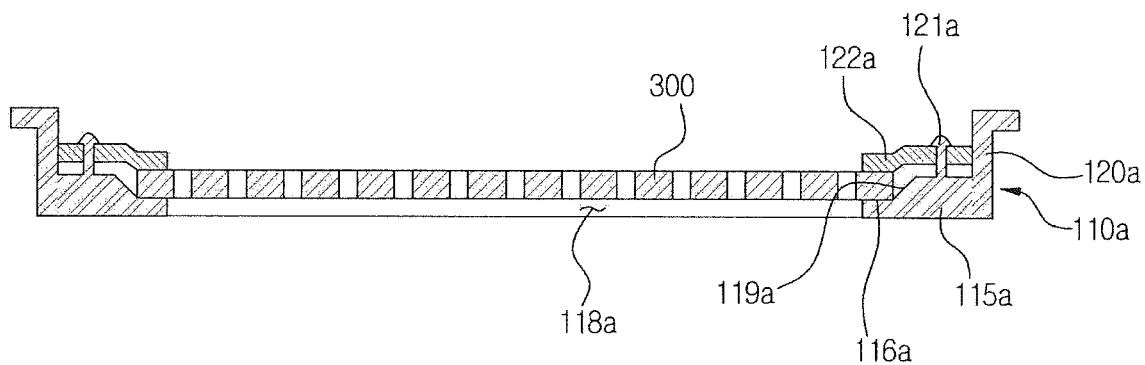
FIG. 11 is a sectional view of a fluid permeable member according to a third preferred embodiment of the present invention.

In FIG. 11, there is shown a third embodiment of the present invention. In the third embodiment, a through-hole 118a formed in a support plate 115a has a shape corresponding to the external shape of the fluid permeable anodic oxide film 300. The fluid permeable anodic oxide film 300 is supported in a rim portion that defines the through-hole 118a. In other words, unlike the first embodiment in which a plurality of through-holes 117 is formed, only one vertically-extending through-hole 118a is formed in the third embodiment so as to correspond to the external shape of the fluid permeable anodic oxide film 300. Thus, the reaction gas passing through the fluid permeable anodic oxide film 300 may smoothly flow with no likelihood that the flow of the reaction gas is obstructed by the support plate 115a.

As shown in FIG. 11, the upper surface of the support plate 115a horizontally extends inward from the side wall 120a of the support body 110a and then extends downward in a step-like manner. Thus, a slant surface 119a inclined inward and downward is formed, and a step surface 116a horizontally extending inward from the lower end of the slant surface 119a is formed. The fluid permeable anodic oxide film 300 is placed on and supported by the step surface 116a. The peripheral edge portion of the lower surface of the fluid permeable anodic oxide film 300 is supported by the step surface 116a. Due to the existence of the slant surface 119a, it is possible to easily position the fluid permeable anodic oxide film 300 on the step surface 116a.

Hooks 121a protruding upward is formed on the upper surface of the support plate 115a adjacent to the side wall 120a. Pressing members 122a are installed so as to be spaced apart from the upper surface of the support plate 115a. The hooks 121a are fitted to the pressing members 122a, whereby the pressing members 122a are fixed to the support plate 115a. Thus, the pressing members 122a press the peripheral edge portion of the upper surface of the fluid permeable anodic oxide film 300. As a result, the fluid permeable anodic oxide film 300 is fixed between the step surface 116a and the pressing members 122a. This prevents the fluid permeable anodic oxide film 300 from being bulged downward.

While preferred embodiments of the present invention have been described above, the present invention is not limited to the aforementioned embodiments. It goes without saying that a person skilled in the relevant art may make various changes and modifications without departing from the spirit and scope of the invention defined in the claims.

What is claimed is:

1. A fluid permeable member, comprising:
    a support body including a support plate having a fluid permeable through-hole, wherein the support plate is formed in a lower portion of the support body; and
    a fluid permeable anodic oxide film disposed on the support plate,
    wherein the fluid permeable anodic oxide film includes a porous layer and a barrier layer formed under the porous layer,
    wherein the porous layer includes a plurality of pores and a plurality of permeation holes each having a larger inner width than each of the pores and vertically penetrating the fluid permeable anodic oxide film,
    wherein lower ends of the pores are closed by the barrier layer and the pores positioned between two adjacent permeation holes, and
    wherein the fluid permeable anodic oxide film is formed only by anodized metallic base material which was removed unanodized metallic base material.

2. The fluid permeable member of claim 1, wherein the fluid permeable anodic oxide film is formed by anodizing a metallic base material and then removing the metallic base material.

3. The fluid permeable member of claim 1, wherein the support plate has a mesh structure.

4. The fluid permeable member of claim 1, wherein the support plate is divided into a plurality of regions, and
    the fluid permeable anodic oxide film is installed in each of the regions.

5. The fluid permeable member of claim 1, wherein the support body is made of a metal.

6. The fluid permeable member of claim 1, wherein the fluid permeable through-hole has a shape corresponding to an external shape of the fluid permeable anodic oxide film, and
    the fluid permeable anodic oxide film is supported in a rim portion defining the through-hole.

* * * * *